United States Patent
Noguchi et al.

(10) Patent No.: US 7,419,916 B2
(45) Date of Patent: Sep. 2, 2008

(54) MANUFACTURING METHOD OF SEMICONDUCTOR DEVICE

(75) Inventors: Junji Noguchi, Fussa (JP); Hideo Aoki, Musasimurayama (JP); Shoji Hotta, Ome (JP); Takayuki Oshima, Ome (JP)

(73) Assignee: Renesas Technology Corp., Tokyo (JP)

( * ) Notice: Subject to any disclaimer, the term of this patent is extended or adjusted under 35 U.S.C. 154(b) by 175 days.

(21) Appl. No.: 11/516,762

(22) Filed: Sep. 7, 2006

(65) Prior Publication Data

US 2007/0004189 A1 Jan. 4, 2007

Related U.S. Application Data

(63) Continuation of application No. 10/981,662, filed on Nov. 5, 2004, now Pat. No. 7,109,127.

(30) Foreign Application Priority Data

Nov. 6, 2003 (JP) ............................. 2003-377411

(51) Int. Cl.
*H01L 21/302* (2006.01)
*H01L 21/461* (2006.01)
*H01L 21/44* (2006.01)

(52) U.S. Cl. ...................... 438/743; 438/687; 438/737; 257/E21.31

(58) Field of Classification Search ................ 438/737, 438/743, 687, 630; 257/E21.31
See application file for complete search history.

(56) References Cited

U.S. PATENT DOCUMENTS 5,932,492 A 8/1999 Hahm et al.

| | | | |
|---|---|---|---|
| 2003/0032292 A1 * | 2/2003 | Noguchi | 438/692 |
| 2003/0064603 A1 | 4/2003 | Komada | |
| 2005/0051900 A1 | 3/2005 | Liu et al. | |
| 2006/0223270 A1 * | 10/2006 | Hara | 438/294 |

FOREIGN PATENT DOCUMENTS

| | | |
|---|---|---|
| JP | 2000-311899 | 11/2000 |
| JP | 2003-168738 | 6/2003 |
| JP | 2003-188254 | 7/2003 |
| KR | 2003-0051359 | 6/2003 |

OTHER PUBLICATIONS

Korean Official Action, dated Feb. 2, 2006, for No. 10-2004-0089195.

* cited by examiner

*Primary Examiner*—Scott B. Geyer
*Assistant Examiner*—Seahvosh J Nikmanesh
(74) *Attorney, Agent, or Firm*—Antonelli, Terry, Stout & Kraus, LLP.

(57) ABSTRACT

The present invention provides a method for preventing the defect the in shape of via holes cased when an alumina mask is used for the dry etching of an interlayer insulator composed of an SiOC film in the dual damascene process in which via holes are formed prior to forming wiring trenches. That is, after forming an alumina mask on an interlayer insulator composed of a low-k SiOC film via a cap insulator, the cap insulator and the interlayer insulator are dry-etched with using a photoresist film as a mask to form via holes. Next, after removing the photoresist film, the inside of the via holes are cleaned by using dilute hydrofluoric acid solution to remove alumina residue. Thereafter, the cap insulator and the interlayer insulator are dry-etched with using the alumina mask as a mask to form wiring trenches.

8 Claims, 21 Drawing Sheets

30: INTERLAYER INSULATOR
32a: ALUMINA MASK
37: VIA HOLE

MANUFACTURING METHOD OF SEMICONDUCTOR DEVICE

CROSS-REFERENCE TO RELATED APPLICATION

The present application claims priority from Japanese Patent Application JP 2003-377411 filed on Nov. 6, 2003, the content of which is hereby incorporated by reference into this application. This application is a Continuation application of application Ser. No. 10/981,662, filed Nov. 5, 2004 now U.S. Pat. No. 7,109,127, the contents of which are incorporated herein by reference in their entirety.

TECHNICAL FIELD OF THE INVENTION

The present invention relates to a technique for manufacturing a semiconductor device. More particularly, the present invention relates to a technique effectively applied to the manufacture of a semiconductor device having the wiring composed of a conductive film made of copper (Cu).

BACKGROUND OF THE INVENTION

As a technique for realizing a high-speed and high-performance LSI, the reduction of dielectric constant of an interlayer insulator and the adoption of Cu wiring formed by using the damascene method have become more and more indispensable. Especially, the reduction of dielectric constant of an interlayer insulator is a quite important technique because it can reduce not only the capacity between wirings but also the power consumption in the LSI.

As the damascene method, the single damascene method in which plugs are embedded in via holes and then Cu wiring is formed in wiring trenches and the dual damascene method in which the Cu wiring is formed simultaneously in the via holes and the wiring trenches are known. However, from the viewpoint of the reduction in the number of process steps, it is expected that the dual damascene method will become the mainstream.

An example of the process of forming the Cu wiring by the use of the dual damascene method will be described. First, an interlayer insulator is formed on a lower wiring and then an insulator for a hard mask is deposited on the interlayer insulator. Subsequently, the dry etching is performed with using a photoresist film as a mask so as to form the via holes in the insulator for a hard mask and the interlayer insulator. Next, after removing the photoresist film, the dry etching is performed halfway into the interlayer insulator with using the insulator for a hard mask as a mask, thereby forming wiring trenches. As described above, since the etching of the interlayer insulator is stopped halfway in the process of forming the wiring trenches, an insulator having an etching selectivity to the interlayer insulator higher than that of a photoresist film is used as the mask in this etching. Thereafter, the Cu film is embedded in the via holes and the wiring trenches by sputtering or plating, and then, the Cu film outside the wiring trenches is removed by the chemical mechanical polishing. In this manner, the Cu wiring is formed.

Japanese Patent Application Laid-Open No. 2003-168738 discloses the case where an SiOC insulator having a dielectric constant lower than that of a silicon oxide film is used as an interlayer insulator used when forming the Cu wiring by the damascene method, wherein a silicon nitride film, a silicon carbide (SiC) film, and an SiCN (silicon carbonitride) film are shown as an insulator for a hard mask.

Although it does not relate to the damascene method, Japanese Patent Application Laid-Open No. 2000-31899 discloses a technique for patterning the metal wiring of fine lines and spaces, in which a hard mask layer composed of a metal oxide film and a photoresist film deposited thereon are used as masks. It is said that tantalum oxide, alumina, and titanium dioxide are preferably used as the metal oxide.

SUMMARY OF THE INVENTION

As a result of the examination of the dual damascene process in which an SiOC film is used as a material of low-k interlayer insulator, the inventors of the present invention have found out that the etching selectivity of the hard mask and the interlayer insulator is insufficient when a silicon nitride film, an SiC film, or an SiCN film is used as the hard mask in the process of forming the wiring trenches in the interlayer insulator.

Consequently, the inventors of the present invention have examined various insulating materials for a hard mask as an alternative to the above-described insulator. As a result, it is discovered that alumina ($Al_2O_3$) has a sufficient etching selectivity to an SiOC film. A method of forming the Cu wiring executed by the inventors in which an alumina film is used as a hard mask will be described below.

First, a first-layer Cu wiring is formed on a semiconductor substrate by the known single damascene method. Thereafter, a barrier insulator, an interlayer insulator composed of an SiOC film, a cap insulator composed of a silicon oxide film, and an alumina film are sequentially deposited on the first-layer wiring. The barrier insulator is an insulator for preventing the diffusion of Cu in the first-layer wiring into the interlayer insulator and is composed of an SiC film or an SiCN film. The cap insulator is an insulator for protecting an SiOC film (interlayer insulator) with a lower mechanical strength in comparison to a silicon oxide film when the Cu wiring is formed by the chemical mechanical polishing and is composed of a silicon oxide film.

Next, the alumina film is patterned by the dry etching performed with using a first photoresist film as a mask, thereby forming an alumina mask. Thereafter, the first photoresist film is removed, and then, the dry etching of the cap insulator and the interlayer insulator is performed with using a second photoresist film having via hole forming regions therein as a mask, thereby forming via holes on the first-layer wiring. Subsequently, after removing the second photoresist film, the dry etching of the cap insulator and the interlayer insulator is performed with using the alumina mask as a mask, thereby forming wiring trenches.

In the process described above, when forming the wiring trenches in the interlayer insulator by the dry etching with using the alumina mask as a mask, the alumina mask exhibits high selectivity to the SiOC film (interlayer insulator). However, if the second photoresist film and the alumina mask are misaligned, the edge of the alumina mask is exposed to the inside of the via holes when the via holes are formed prior to forming the wiring trenches. Therefore, the exposed part of the alumina mask is also etched simultaneously, and the alumina residue is adhered to the sidewall and the bottom surface of the via holes. As a result, at the portion to which the alumina residue is adhered, the alumina residue functions as the etching mask and the subsequent etching of the interlayer insulator is prevented. Consequently, the via holes cannot be formed correctly.

An object of the present invention is to provide a technique capable of preventing the defect in shape of the via holes which may be caused when an alumina mask is used in the dry etching of an interlayer insulator composed of an SiOC film in the dual damascene process in which via holes are formed prior to forming wiring trenches.

The above and other objects and novel characteristics of the present invention will be apparent from the description and the accompanying drawings of this specification.

The typical ones of the inventions disclosed in this application will be briefly described as follows.

A manufacturing method of a semiconductor device according to the present invention comprises the steps as follows. That is:

(a) a step of forming an interlayer insulator mainly composed of an SiOC film on a semiconductor substrate having a conductive layer thereon, and then, forming an alumina mask in which wiring trench forming regions are opened on the interlayer insulator;

(b) after the step (a), a step of performing dry etching with using a photoresist film as a mask to form via holes in the interlayer insulator on the conductive layer;

(c) a step of removing the photoresist film and then cleaning the inside of the via holes by using hydrofluoric acid;

(d) after the step (c), a step of performing dry etching with using the alumina mask as a mask to form wiring trenches in the interlayer insulator;

(e) after the step (d), a step of removing the alumina mask; and (f) after the step (e), a step of forming wiring composed of a conductive film mainly made of copper in the via holes and the wiring trenches, thereby electrically connecting the wiring and the conductive layer.

A manufacturing method of a semiconductor device according to the present invention comprises the steps as follows. That is:

(a) a step of forming an interlayer insulator mainly composed of an SiOC film on a semiconductor substrate having a conductive layer thereon, and then, forming an alumina mask in which wiring trench forming regions are opened on the interlayer insulator;

(b) after the step (a), a step of forming an organic SOG film on the alumina mask and forming an inorganic SOG film on the organic SOG film;

(c) a step of performing dry etching with using a photoresist film as a mask to form openings in the organic SOG film and the inorganic SOG film in via hole forming regions;

(d) after the step (c), a step of removing the photoresist film;

(e) after the step (d), a step of performing dry etching with using the organic SOG film and the inorganic SOG film as masks to form via holes in the interlayer insulator on the conductive layer and remove the inorganic SOG film;

(f) a step of removing the organic SOG film by wet etching, and then, performing dry etching with using the alumina mask as a mask to form wiring trenches in the interlayer insulator;

(g) after the step (f), a step of removing the alumina mask; and (h) after the step (g), a step of forming wiring composed of a conductive film mainly made of copper in the via holes and the wiring trenches, thereby electrically connecting the wiring and the conductive layer.

The effect obtained by the representative one of the inventions disclosed in this application will be briefly described as follows.

It becomes possible to prevent the defect in shape of the via hole even when an alumina mask is used in the dry etching of an interlayer insulator composed of an SiOC film in the dual damascene process in which via holes are formed prior to forming wiring trenches.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted.

First Embodiment

The first embodiment is applied to a CMOS-LSI having multilayer wirings, and the manufacturing method thereof will be described along the process steps with reference to FIGS. 1 to 15.

Figure 1:
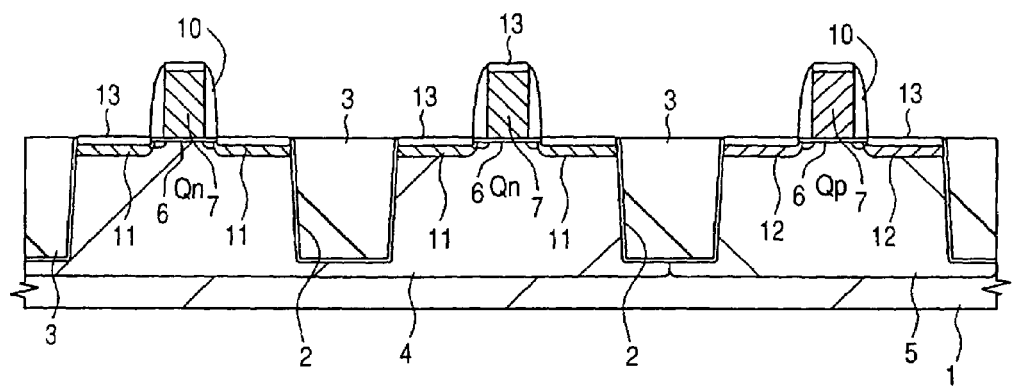
FIG. 1 is a cross-sectional view showing the principal part of a semiconductor substrate in the manufacturing process of a semiconductor device according to an embodiment of the present invention.

First, as shown in FIG. 1, an n channel MISFET (Qn) and a p channel MISFET (Qp) are formed on a main surface of a semiconductor substrate (hereinafter, simply referred to as a substrate) 1 made of single crystal silicon by using a known semiconductor manufacturing method. The reference numeral 2 in the drawings denotes a device isolation trench formed by embedding a silicon oxide film 3 in a trench formed by the etching of the substrate 1. The reference numeral 4 denotes a p type well and the reference numeral 5 denotes an n type well, which are formed by performing the thermal process after implanting impurity ions into the substrate 1.

The n channel MISFET (Qn) comprises: a gate insulator 6 composed of a silicon oxide film or a silicon oxynitride film formed on a surface of the p type well 4; a gate electrode 7 composed of a polysilicon film formed on the gate insulator 6; a sidewall spacer 10 composed of a silicon oxide film formed on the sidewall of the gate electrode 7; a pair of n type semiconductor regions (source and drain) 11 formed in the p type wells 4 on both sides of the gate electrode 7; and the like. The p channel MISFET (Qp) comprises: a gate insulator 6; a gate electrode 7; a sidewall spacer 10; a pair of p type semiconductor regions (source and drain) 12 formed in the n type well 5 on both sides of the gate electrode 7; and the like. P (Phosphorus) is introduced into the polysilicon film which composes the gate electrode 7 of the n channel MISFET (Qn), and B (boron) is introduced into the polysilicon film which composes the gate electrode 7 of the p channel MISFET (Qp). Also, in order to reduce the resistance in the gate electrode 7 and the source and drain, a C (Cobalt) silicide film 13 is formed on the surfaces of the gate electrode 7 of the n channel MISFET (Qn) and the n type semiconductor regions (source and drain) 11 and on the surfaces of the gate electrode 7 of the p channel MISFET (Qp) and the p type semiconductor regions (source and drain) 12.

Figure 2:
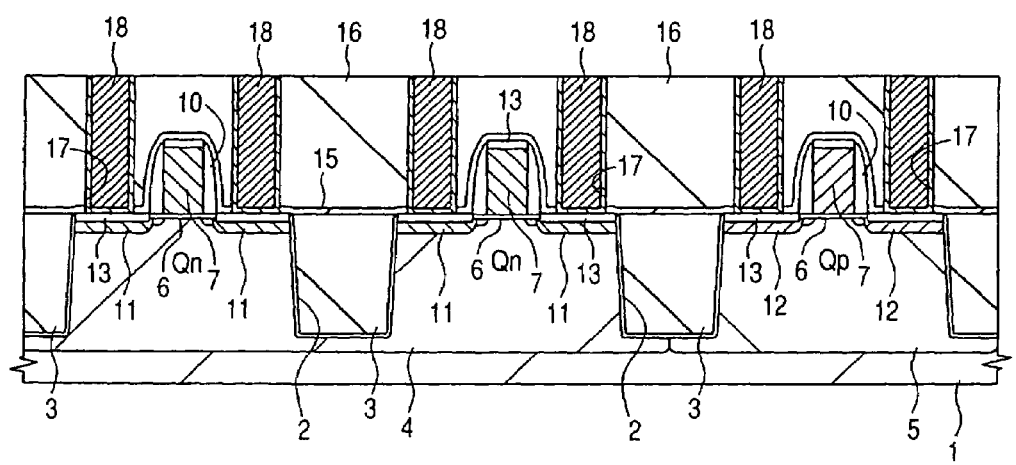
FIG. 2 is a cross-sectional view subsequent to FIG. 1 showing the principal part of a semiconductor substrate in the manufacturing process of a semiconductor device.

Next, as shown in FIG. 2, after depositing a silicon nitride film 15 and a silicon oxide film 16 on the substrate 1 by the CVD, the surface of the silicon oxide film 16 is planarized by the chemical mechanical polishing. Subsequently, the silicon oxide film 16 and the silicon nitride film 15 on the n type semiconductor regions (source and drain) 11 of the n channel MISFET (Qn) and the p type semiconductor regions (source and drain) 12 of the p channel MISFET (Qp) are etched to form contact holes 17, and then, plugs 18 are formed in the contact holes 17. The plug 18 is composed of, for example, a laminated film of a barrier film made of TiN (titanium nitride) and a W (tungsten) film.

Figure 3:
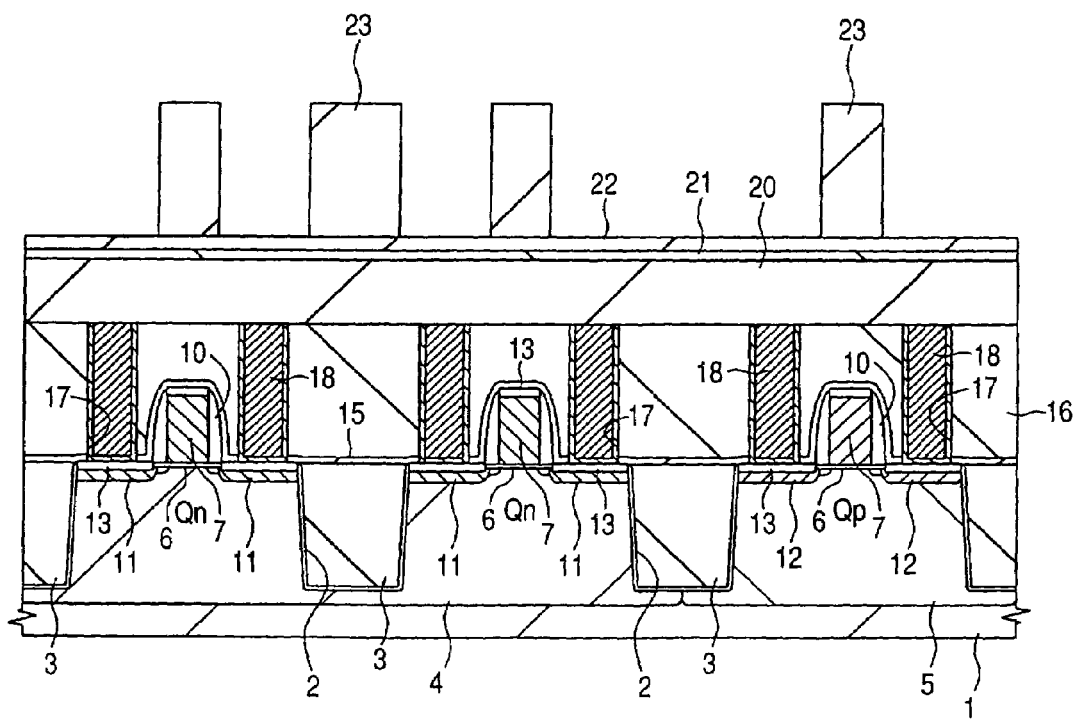
FIG. 3 is a cross-sectional view subsequent to FIG. 2 showing the principal part of a semiconductor substrate in the manufacturing process of a semiconductor device.

Next, as shown in FIG. 3, after depositing an SiOC film 20 and a cap insulator 21 by CVD on the silicon oxide film 16, a photoresist film 23 in which wiring forming regions are opened is formed on the cap insulator 21. An antireflection film 22 is formed below the photoresist film 23 according to need. The cap insulator 21 is composed of a silicon oxide film deposited by CVD, which is formed for protecting the SiOC film 20 with a mechanical strength lower than a silicon oxide film when forming the Cu wiring by the chemical mechanical polishing.

As the SiOC film 20, p-MTES (produced by Hitachi Chemical Co., Ltd., relative dielectric constant of 3.2), CORAL (produced by Novellus Systems, Inc, USA, relative dielectric constant of 2.7 to 2.4, upper temperature limit of 500° C.), and Aurora 2.7 (produced by Japan ASM, relative dielectric constant of 2.7, upper temperature limit of 450° C.) are available. In addition, for the further reduction of the dielectric constant, a porous film may be used. These SiOC materials can be formed by CVD. For example, p-MTES is formed by CVD using the mixed gas of methyltriethoxysilane and $N_2O$.

Figure 4:
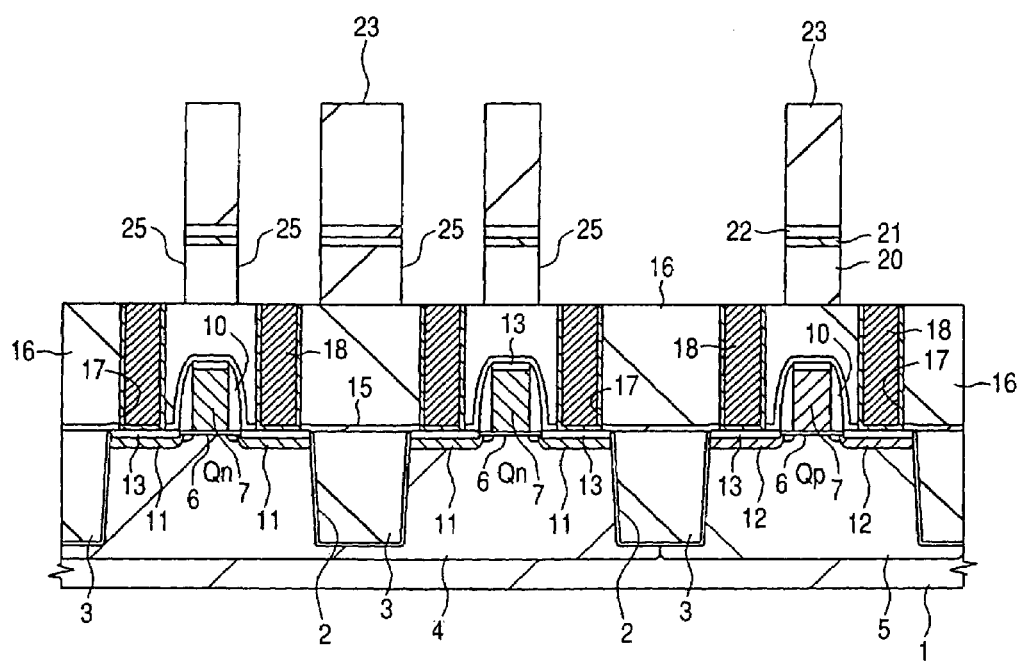
FIG. 4 is a cross-sectional view subsequent to FIG. 3 showing the principal part of a semiconductor substrate in the manufacturing process of a semiconductor device.

Next, as shown in FIG. 4, the dry etching of the antireflection film 22, the cap insulator 21, and the SiOC film 20 is performed with using a photoresist film 23 as a mask, thereby forming wiring trenches 25 on the silicon oxide film 16. The thickness of first-layer wiring 26 formed on the silicon oxide film 16 in the subsequent process is defined by the thickness of the cap insulator 21 and the SiOC film 20.

Figure 5:
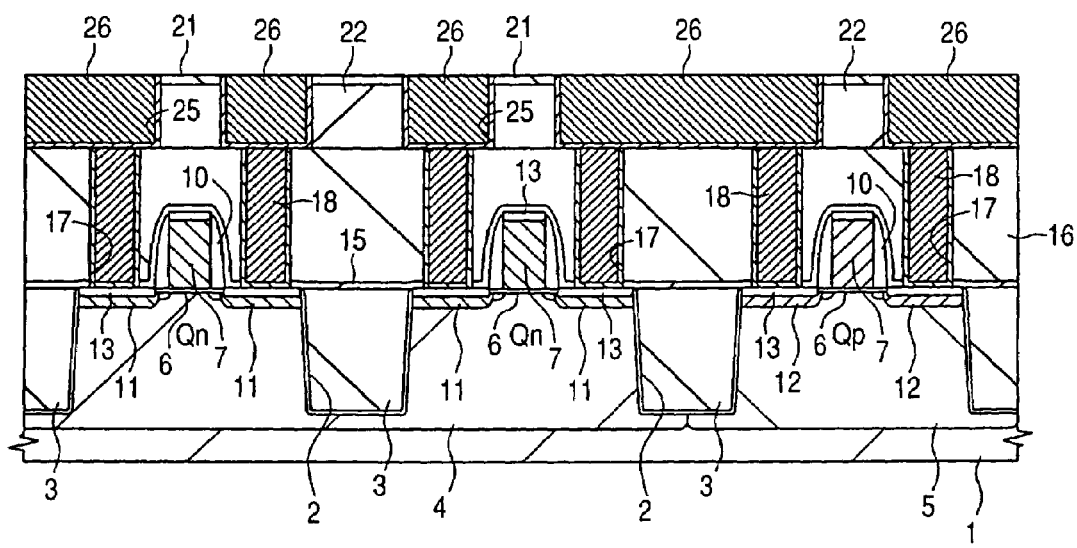
FIG. 5 is a cross-sectional view subsequent to FIG. 4 showing the principal part of a semiconductor substrate in the manufacturing process of a semiconductor device.

Next, after removing the photoresist film 23 and the antireflection film 22 by ashing, the first-layer wiring 26 is formed in the wiring trenches 25 as shown in FIG. 5. The first-layer wiring 26 is electrically connected to the source and drain (n type semiconductor regions 11) of the n channel MISFET (Qn) and the source and drain (p type semiconductor regions 12) of the p channel MISFET (Qp) through the underlying plugs 18.

The first-layer wiring 26 is formed in the following manner. First, a TiN film which is thin (about 50 nm) enough not to fill the wiring trenches 25 is deposited by sputtering, and then, a Cu film which is thick (about 800 to 1600 nm) enough to completely fill the wiring trenches 25 is deposited by sputtering or plating. Thereafter, the Cu film and the TiN film outside the wiring trenches 25 are removed by chemical mechanical polishing. In this case, it is also preferable to form a laminated structure by sequentially depositing a TiN film with a thickness of about 15 nm and a Ti film with a thickness of about 15 nm instead of the single TiN film. The TiN film functions as a barrier film for preventing the diffusion of Cu into the surrounding insulators. In addition to the TiN film, various kinds of conductive films almost unreactive with Cu, for example, a metal nitride film such as a WN (tungsten nitride) film or a TaN (tantalum nitride) film, a metal nitride film added with Si, and a refractory metal film made of Ta, Ti, W, or TiW are available as the barrier film.

Figure 6:
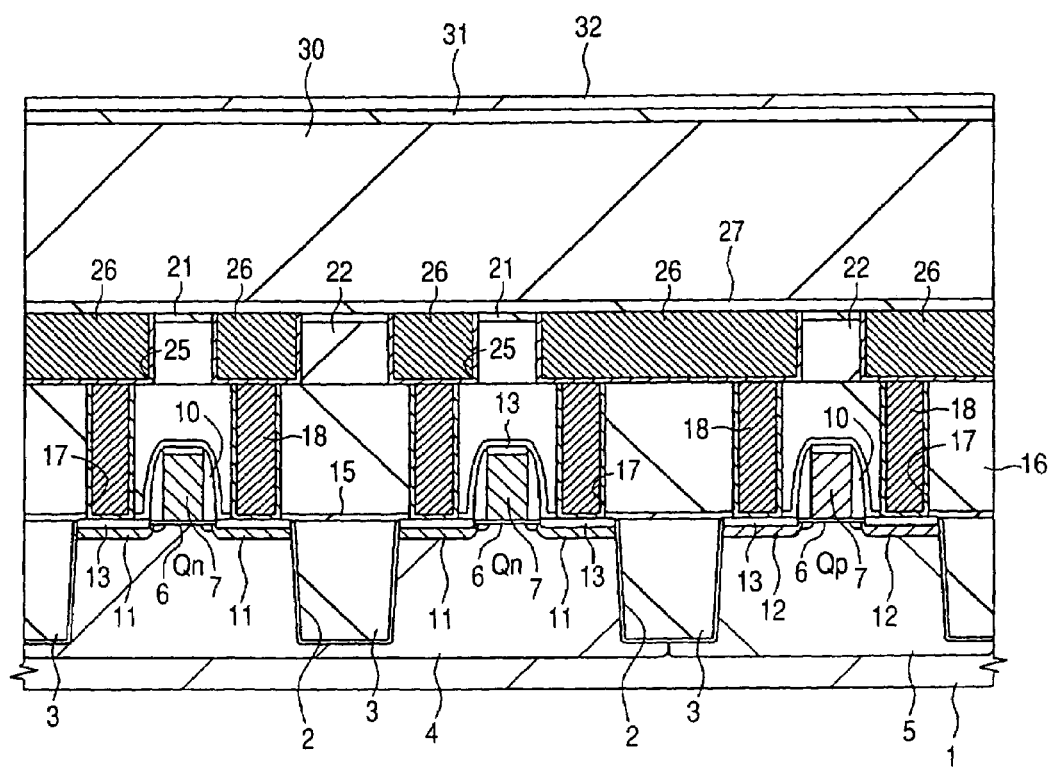
FIG. 6 is a cross-sectional view subsequent to FIG. 5 showing the principal part of a semiconductor substrate in the manufacturing process of a semiconductor device.

Next, as shown in FIG. 6, after depositing a barrier insulator 27 on the first-layer wiring 26, an interlayer insulator 30, a cap insulator 31, and an alumina film 32 are deposited on the barrier insulator 27. The barrier insulator 27 is an insulator for preventing the diffusion of Cu in the first-layer wiring 26 into the interlayer insulator 30, which is composed of, for example, an SiC (silicon carbide) film or an SiCN (silicon carbonitride) film with a thickness of about 10 to 40 nm deposited by plasma CVD. The interlayer insulator 30 is composed of an SiOC film with low dielectric constant in order to reduce the capacitance formed between the first-layer wiring 26 and a second-layer wiring (41) formed in the subsequent process in the upper layer thereof. The SiOC film is deposited by CVD and the thickness thereof is about 460 nm. The cap insulator 31 is composed of a silicon oxide film with a thickness of about 50 nm deposited by CVD, which is formed for protecting the interlayer insulator 30 composed of an SiOC film with a mechanical strength lower than a silicon oxide film when forming the Cu wiring by the chemical mechanical polishing. The alumina film 32 is deposited by sputtering and the thickness thereof is about 30 to 75 nm.

Figure 7:
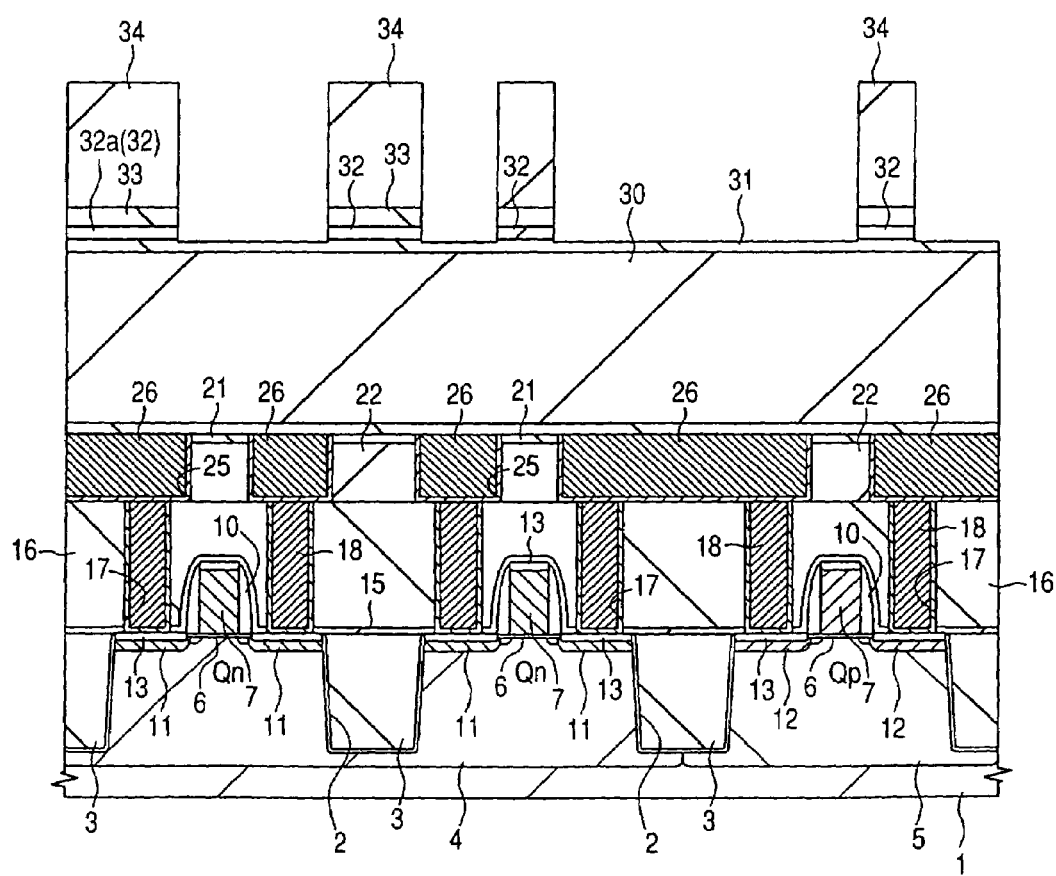
FIG. 7 is a cross-sectional view subsequent to FIG. 6 showing the principal part of a semiconductor substrate in the manufacturing process of a semiconductor device.

Next, as shown in FIG. 7, an antireflection film 33 and a photoresist film 34 in which wiring trench forming regions are opened are deposited on the cap insulator 31, and then, the dry etching of the antireflection film 33 and the alumina film 32 is performed with using the photoresist film 34 as a mask, thereby forming an alumina mask 32a.

Figure 8:
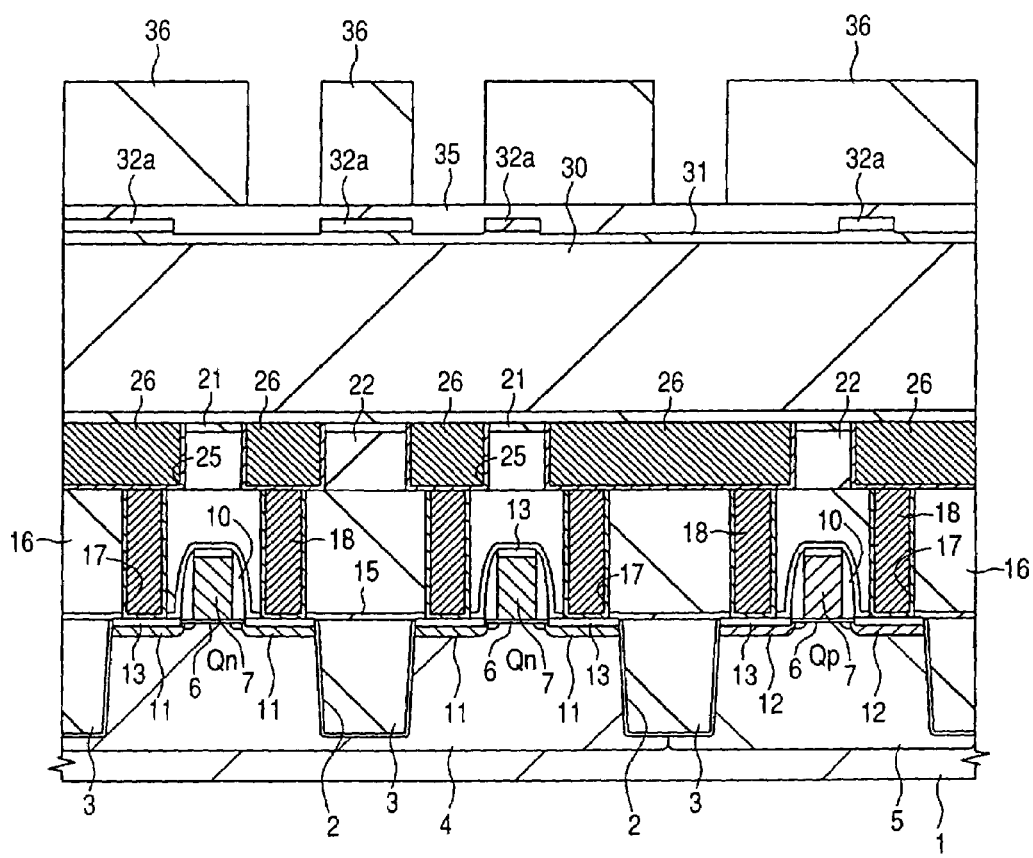
FIG. 8 is a cross-sectional view subsequent to FIG. 7 showing the principal part of a semiconductor substrate in the manufacturing process of a semiconductor device.
Figure 9:
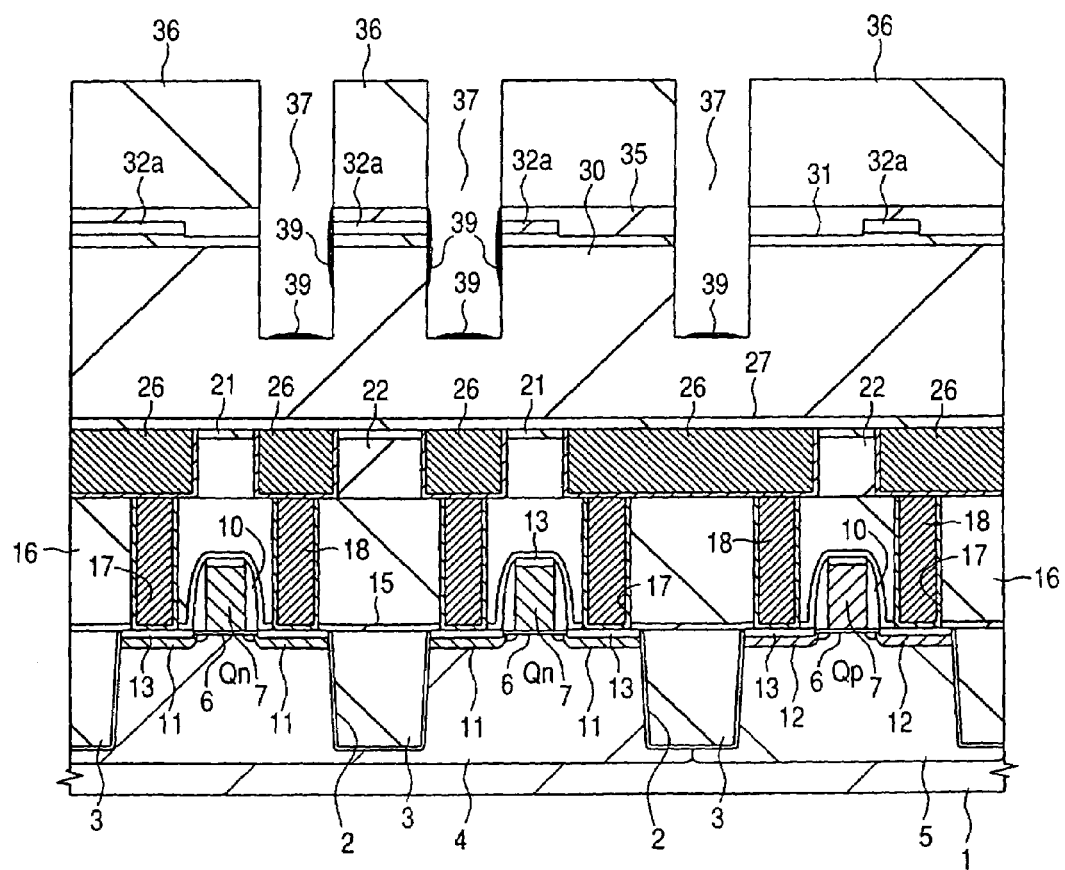
FIG. 9 is a cross-sectional view subsequent to FIG. 8 showing the principal part of a semiconductor substrate in the manufacturing process of a semiconductor device.
Figure 10:
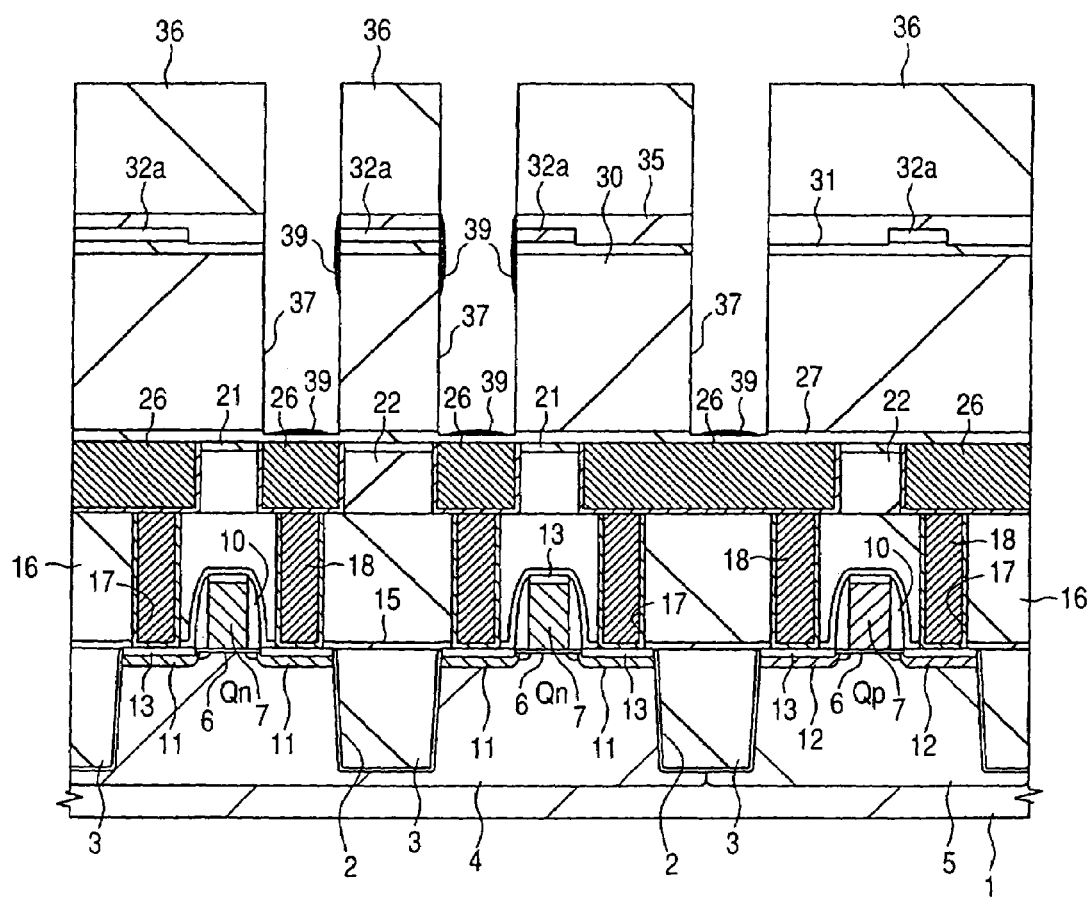
FIG. 10 is a cross-sectional view subsequent to FIG. 9 showing the principal part of a semiconductor substrate in the manufacturing process of a semiconductor device.

Next, after removing the photoresist film 34 and the antireflection film 33 by ashing, an antireflection film 35 and a photoresist film 36 in which via hole forming regions are opened are deposited on the alumina mask 32a as shown in FIG. 8. Then, as shown in FIG. 9, the antireflection film 35, the cap insulator 31 and the interlayer insulator 30 are dry-etched with using the photoresist film 36 as a mask, thereby forming via holes 37. At this time, the etching time is controlled so that the etching is stopped when the bottom surface of the via hole 37 reaches half of the thickness of the interlayer insulator 30. Alternatively, it is also preferable that the etching is continued until the bottom surface of the via hole 37 reaches the barrier insulator 27 below the interlayer insulator 30 as shown in FIG. 10. In this case, though it is possible to simplify the process, since the surface of the barrier insulator 27 is also etched, the surface of the first-layer wiring 26 may be exposed at the bottom of the via hole 37 if the thickness of the barrier insulator 27 is insufficient. Therefore, extra care for preventing the contamination of the surface of the first-layer wiring 26 is necessary.

In the etching process described above, if the photoresist film 36 and the alumina mask 32a are misaligned, the edge of the alumina mask 32a is exposed to the inside of the via hole 37. Therefore, the exposed part of the alumina mask 32a is also etched simultaneously, and alumina residue 39b (see FIG. 9) is adhered to the sidewall and the bottom surface of the via hole 37. As a result, at the portion to which the alumina residue 39 is adhered, the alumina residue 39 functions as the etching mask and the subsequent etching of the interlayer insulator 30 is prevented. Consequently, the via hole cannot be formed correctly.

Figure 11:
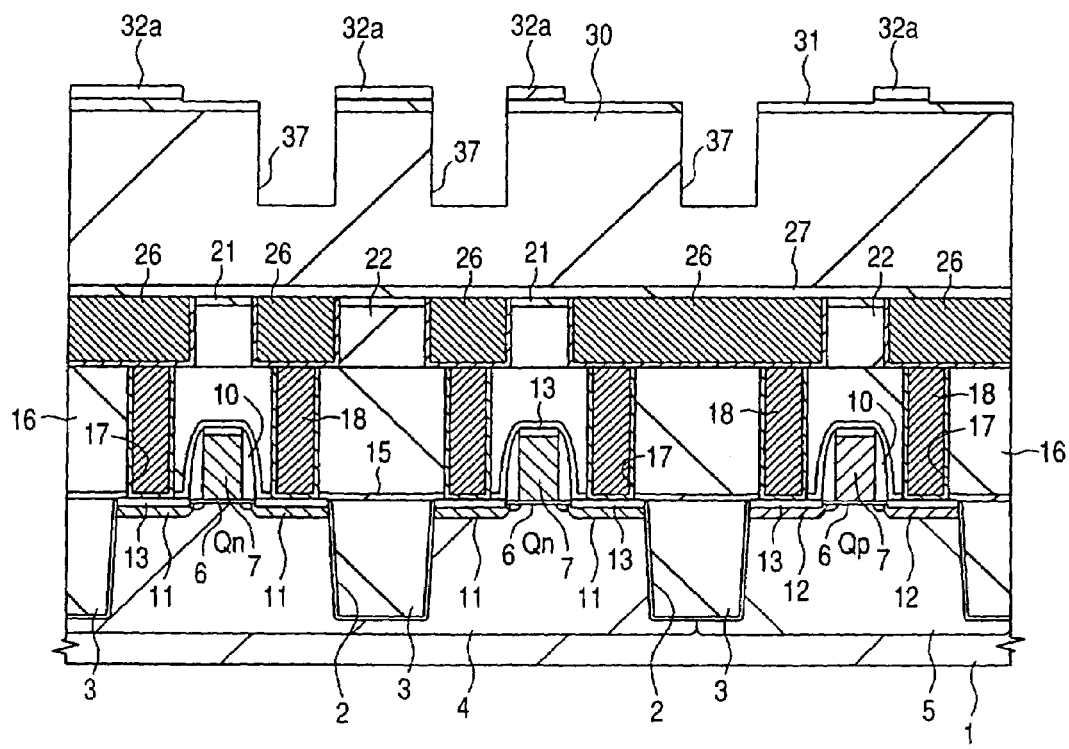
FIG. 11 is a cross-sectional view subsequent to FIG. 10 showing the principal part of a semiconductor substrate in the manufacturing process of a semiconductor device.

For its prevention, in this embodiment, the photoresist film 36 and the antireflection film 35 are removed by ashing after forming the via holes 37, and then, the inside of the via holes 37 is cleaned by the use of dilute hydrofluoric acid as shown in FIG. 11 so as to remove the alumina residue 39. The preferable concentration of hydrofluoric acid solution used in this case is about 0.1 to 0.001%. When the concentration of hydrofluoric acid is high, the alumina mask 32a is also etched to some extent. However, if the concentration is in the above-described range, the etched part of the alumina mask 32a is quite small.

Figure 12:
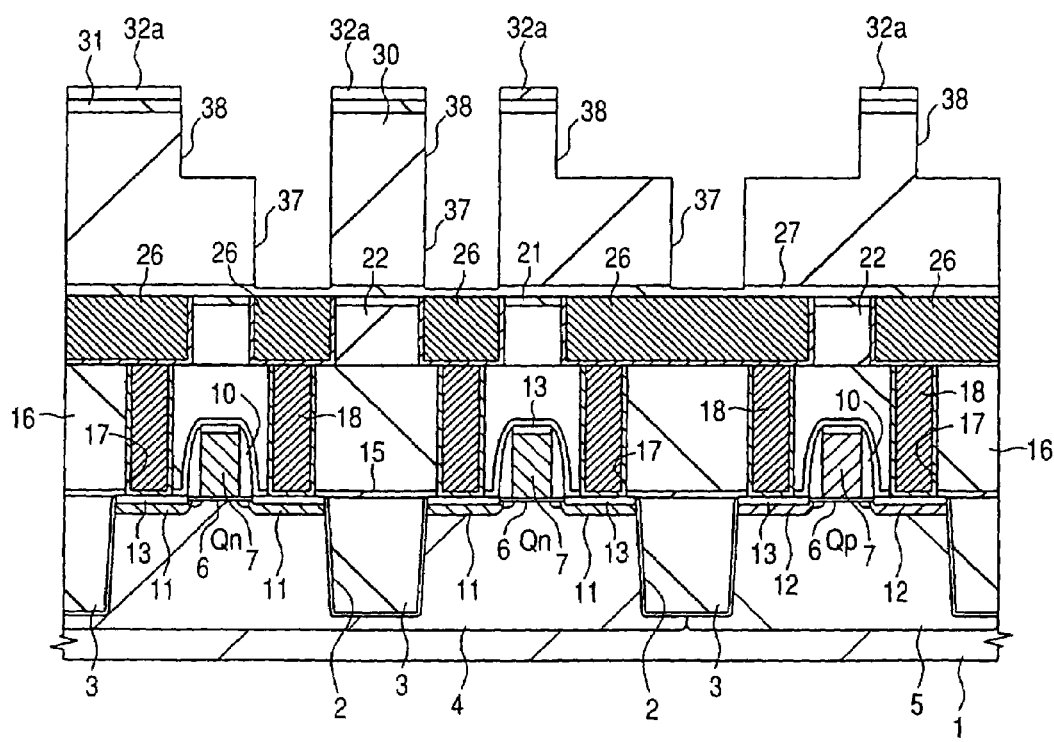
FIG. 12 is a cross-sectional view subsequent to FIG. 11 showing the principal part of a semiconductor substrate in the manufacturing process of a semiconductor device.

Next, as shown in FIG. 12, the cap insulator 31 and the interlayer insulator 30 are dry-etched with using the alumina mask 32a as a mask, thereby forming wiring trenches 38. At this time, the interlayer insulator 30 at the bottom of the via holes 37 is also etched, and the surface of the barrier insulator 27 is exposed. In this case, the etching time is controlled so that the etching is stopped when the bottom surface of the wiring trench 38 reaches half of the thickness of the interlayer insulator 30.

In the above-described etching process in which the interlayer insulator 30 composed of an SiOC film is dry-etched with using the alumina mask 32a as a mask, if the etching is performed at standard gas pressure (for example, 200 to 100 millitorr), the alumina residue generated from the surface of the alumina mask 32a is adhered to the inside of the wiring trenches 38, and therefore, the etching of the interlayer insulator 30 is prevented. Consequently, the wiring trenches 38 cannot be formed correctly.

For its prevention, in this embodiment, the interlayer insulator 30 is etched under the condition of extremely low etching gas pressure. More specifically, the etching gas pressure is set within the range of 20 to 0.2 millitorr, preferably, 10 to 0.2 millitorr. As the etching gas, $CF_4$ (carbon tetrafluoride) is preferable. However, other etching gas such as that obtained by adding $O_2$ and Ar (argon) to $CHF_3$ or $C_5F_8$ is also available. When the etching is performed under such a condition, the problem of the adhesion of alumina residue to the wiring trenches 38 can be solved, and the wiring trenches 38 can be opened correctly.

Figure 13:
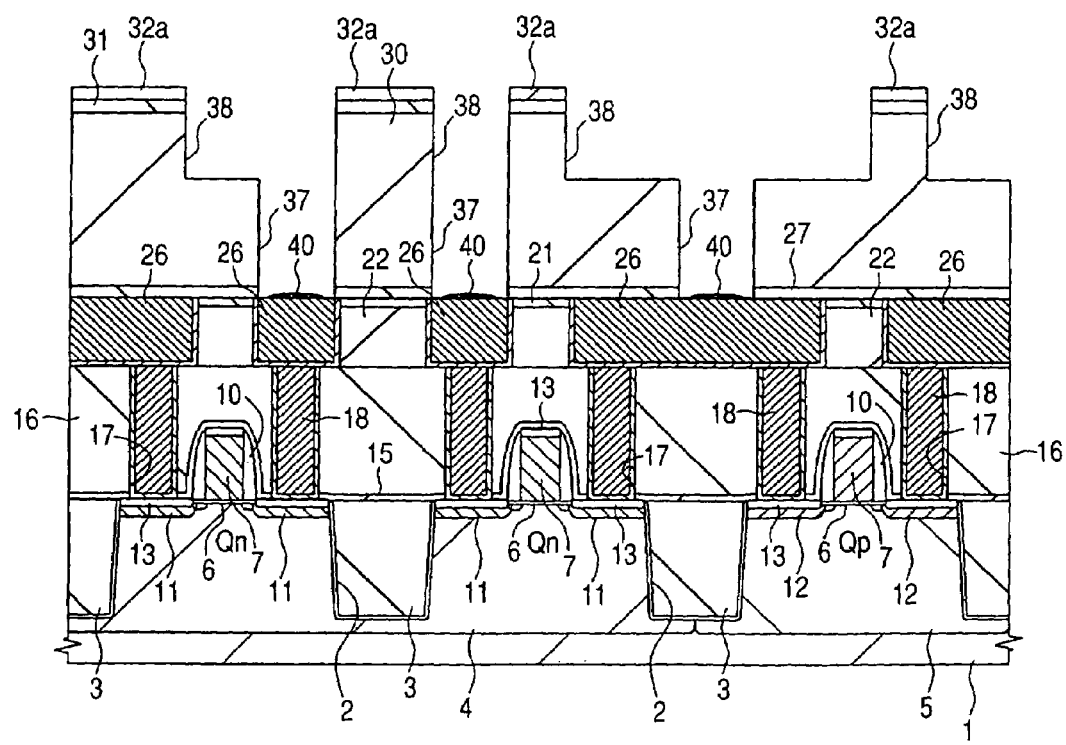
FIG. 13 is a cross-sectional view subsequent to FIG. 12 showing the principal part of a semiconductor substrate in the manufacturing process of a semiconductor device.

Next, as shown in FIG. 13, the barrier insulator 27 exposed at the bottom of the via holes 37 is removed by the dry etching, thereby exposing the first-layer wiring 26 to the bottom surface of the via holes 37. Since the surface of the first-layer wiring 26 exposed to the bottom surface of the via holes 37 is also exposed to the etching gas by this dry etching, Cu polymer 40 formed by the reaction between Cu and the etching gas is adhered to the surface of the first-layer wiring 26.

Figure 14:
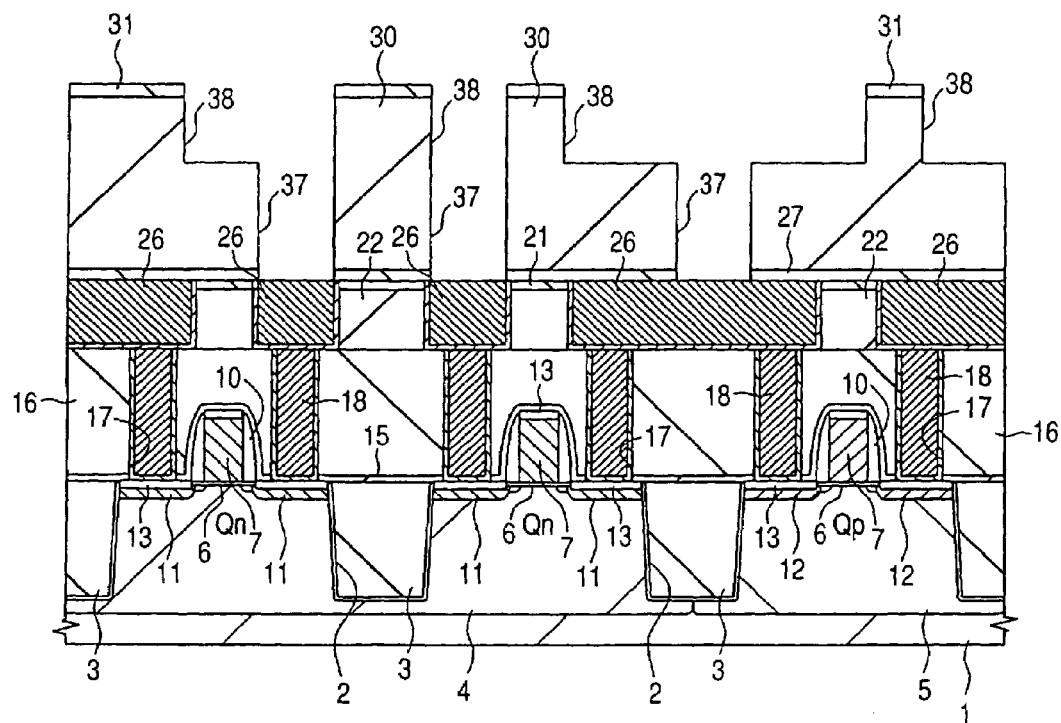
FIG. 14 is a cross-sectional view subsequent to FIG. 13 showing the principal part of a semiconductor substrate in the manufacturing process of a semiconductor device.

Next, as shown in FIG. 14, the alumina mask 32a is removed by the use of the dilute hydrofluoric acid solution, and simultaneously, the Cu polymer 40 adhered to the surface of the first-layer wiring 26 is also removed.

Figure 15:
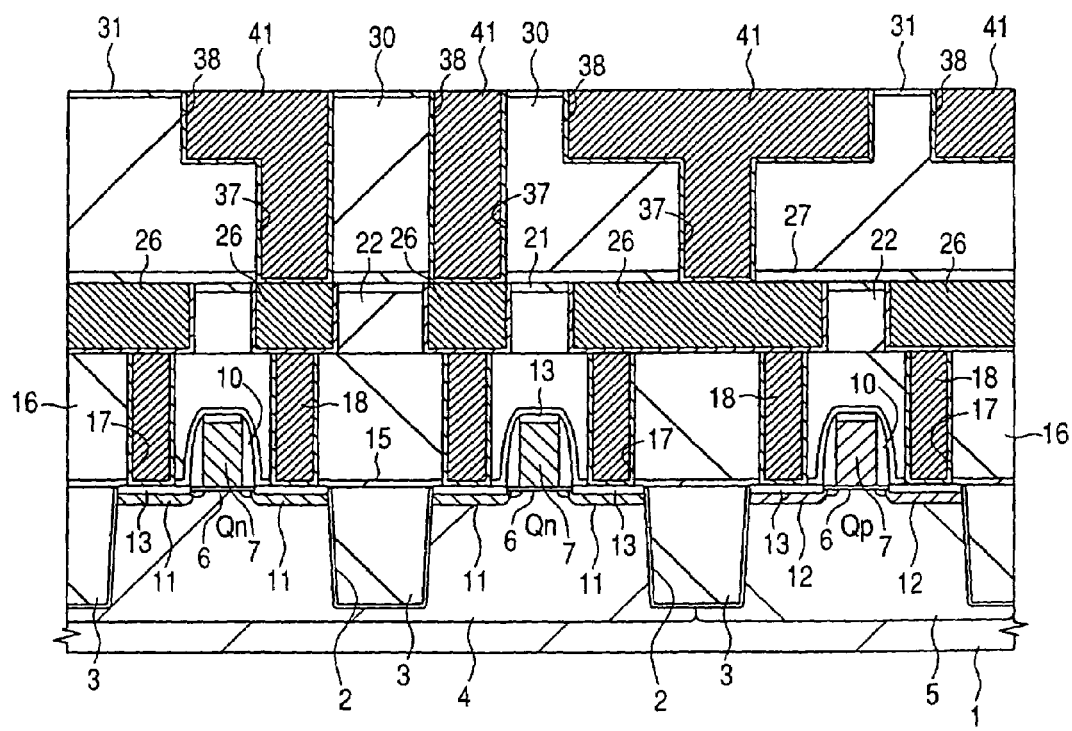
FIG. 15 is a cross-sectional view subsequent to FIG. 14 showing the principal part of a semiconductor substrate in the manufacturing process of a semiconductor device.

Thereafter, as shown in FIG. 15, the second-layer wiring 41 is formed in the wiring trenches 38 and the via holes 37 in a usual manner. That is, a TiN film which is thin enough not to fill the wiring trenches 38 and the via holes 37 is deposited by sputtering, and then, a Cu film which is thick enough to completely fill the wiring trenches 38 and the via holes 37 is deposited by sputtering or plating. Thereafter, the Cu film and the TiN film outside the wiring trenches 38 are removed by the chemical mechanical polishing.

Although not shown, the above-described deposition of the interlayer insulator, formation of wiring trenches and via holes, and embedment of a Cu film are repeated in the subsequent process to form plural layers of Cu wirings on the second-layer wiring 41. Then, the CMOS-LSI in this embodiment can be formed.

Second Embodiment

In the first embodiment, via holes 37 are formed in the interlayer insulator 30 by the dry etching with using the photoresist film 36 as a mask. Thereafter, the photoresist film 36 is removed by ashing, and then, the wiring trenches 38 are formed in the interlayer insulator 30 by the dry etching with using the alumina mask 32a as a mask (see FIGS. 8 to 12).

In the above-described process, the photoresist film 36 is removed by ashing after forming the via holes 37. Therefore, there is the possibility that the interlayer insulator 30 exposed to the sidewall and the bottom surface of the via holes 37 is damaged by the ashing gas, resulting in the defect in shape of the via holes 37. Particularly when the porous film is used in order to further reduce the dielectric constant of the interlayer insulator 30, the damage due to the ashing gas is large. Therefore, a method for preventing the ashing damage to the interlayer insulator 30 will be described in the second embodiment.

Figure 16:
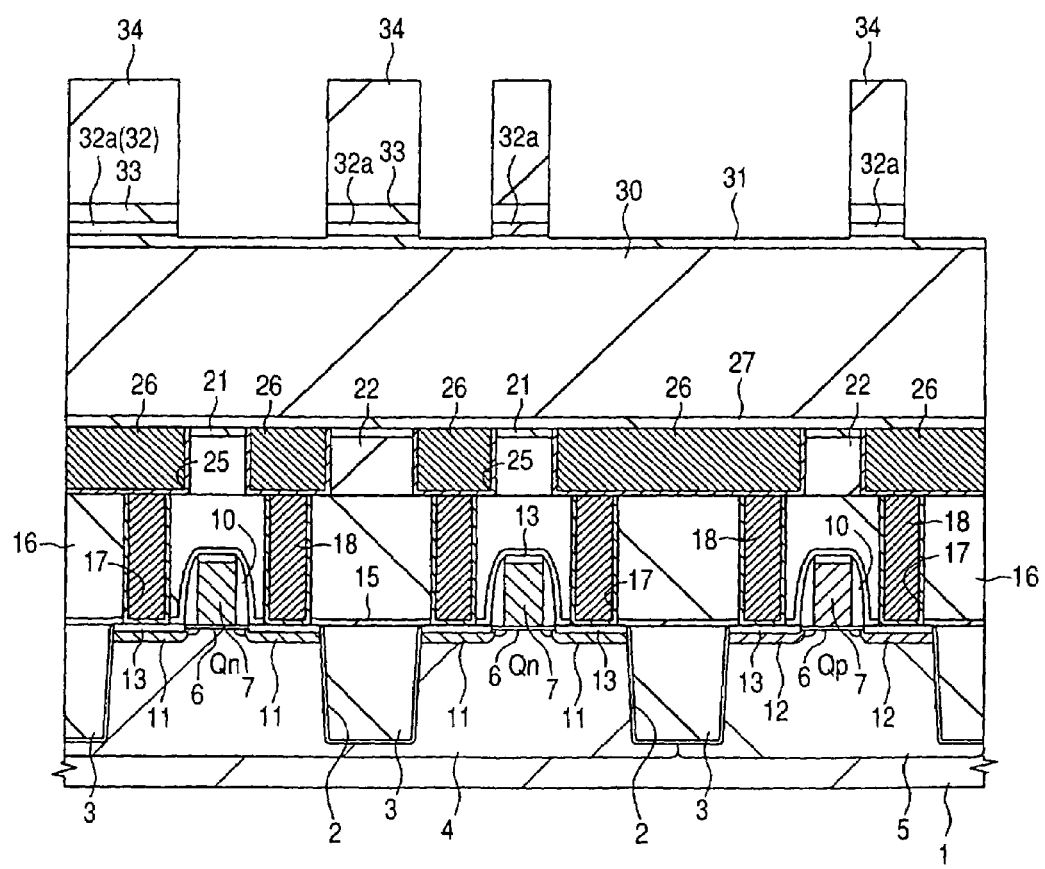
FIG. 16 is a cross-sectional view showing the principal part of a semiconductor substrate in the manufacturing process of a semiconductor device according to another embodiment of the present invention.

First, as shown in FIG. 16, the alumina film 32 is patterned by the dry etching with using the photoresist film 34 as a mask, thereby forming the alumina mask 32a. The processes until here are identical to those described in the first embodiment with reference to FIGS. 1 to 7.

Figure 17:
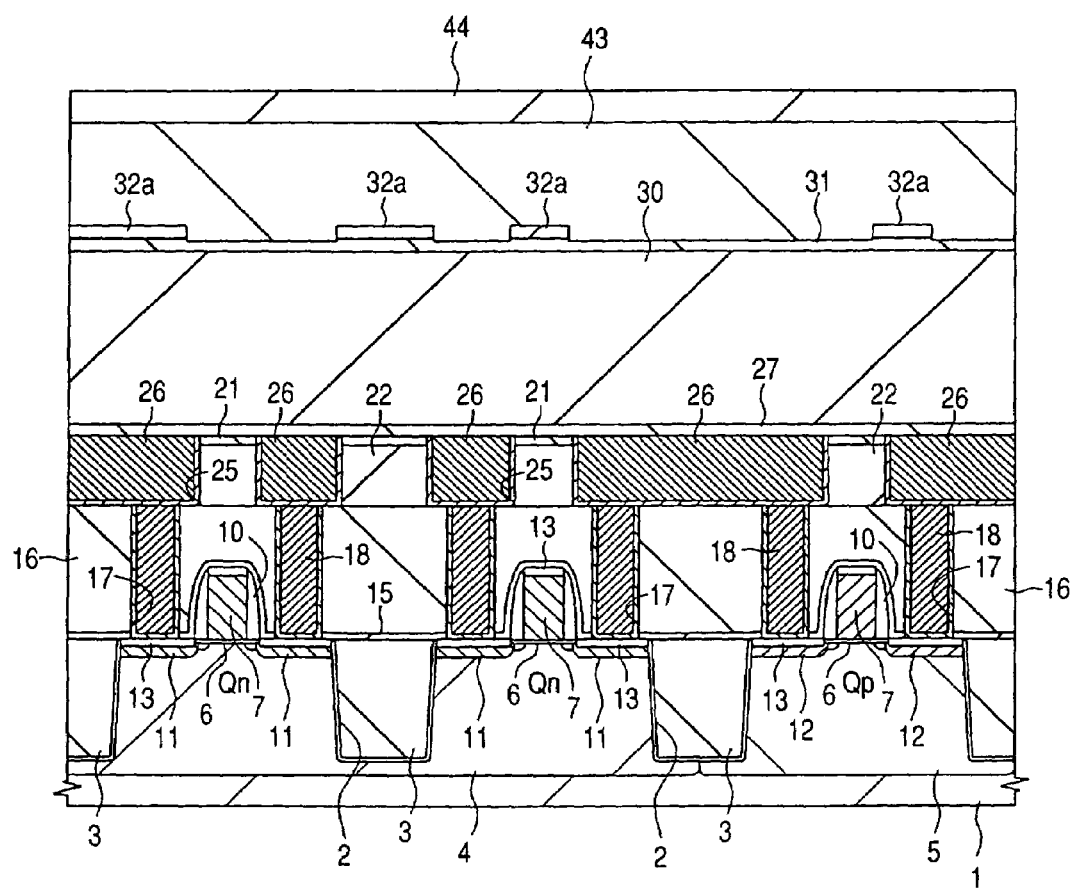
FIG. 17 is a cross-sectional view subsequent to FIG. 16 showing the principal part of a semiconductor substrate in the manufacturing process of a semiconductor device.

Next, the photoresist film 34 and the antireflection film 33 are removed by ashing. Then, as shown in FIG. 17, an organic SOG film 43 is formed on the alumina mask 32a, and an inorganic SOG film 44 is formed on the organic SOG film 43. In this case, the inorganic SOG film 44 has such properties that it is hardly removed by the wet etching and ashing resistance is high. Meanwhile, the organic SOG film 43 has such properties that it can be easily removed by the wet etching and ashing resistance is low when compared with the inorganic SOG film 44. As the inorganic SOG film 44, "Type 12" produced by Tokyo Ohka Kogyo Co., Ltd. is available, and as the organic SOG film 43, "Duo" produced by Honeywell Electronic Materials is available.

Figure 18:
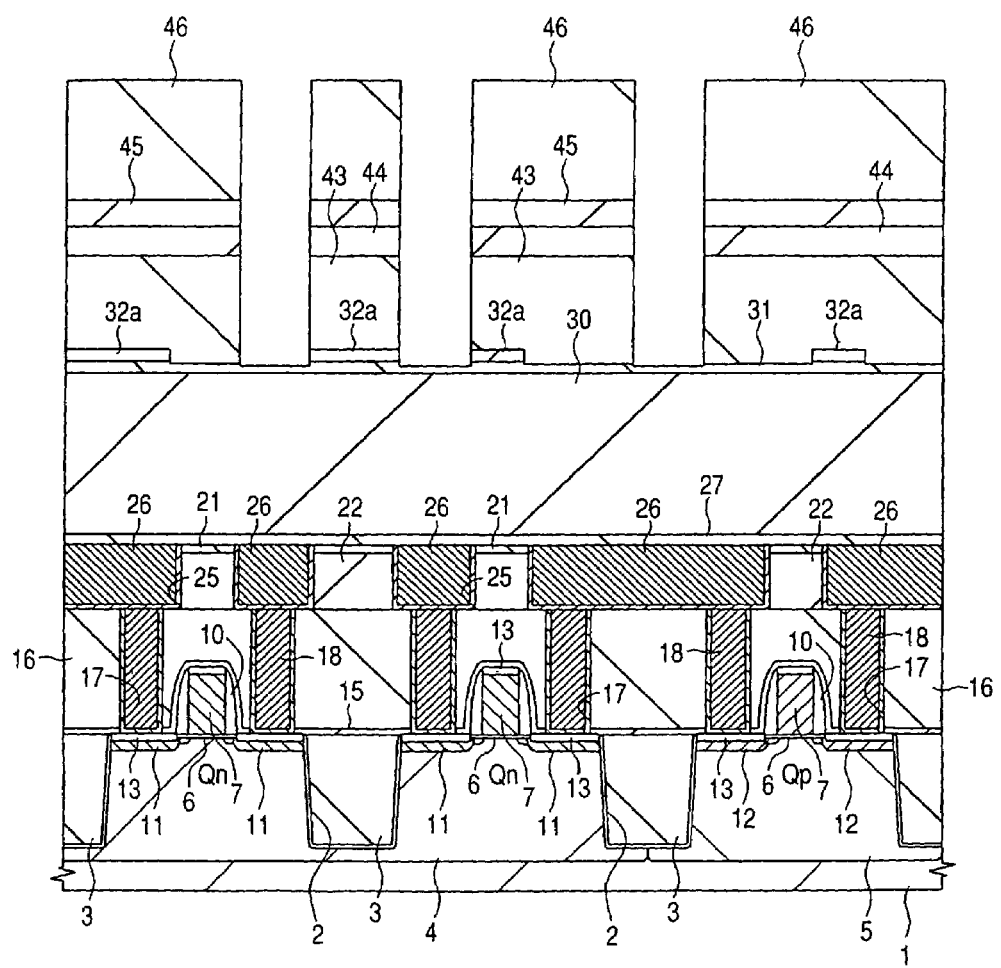
FIG. 18 is a cross-sectional view subsequent to FIG. 17 showing the principal part of a semiconductor substrate in the manufacturing process of a semiconductor device.

Next, as shown in FIG. 18, an antireflection film 45 and a photoresist film 46 in which via hole forming regions are opened are deposited on the inorganic SOG film 44, and then, the dry etching of the antireflection film 45, the inorganic SOG film 44, and the organic SOG film 43 in the via hole forming regions is performed with using the photoresist film 46 as a mask.

Figure 19:
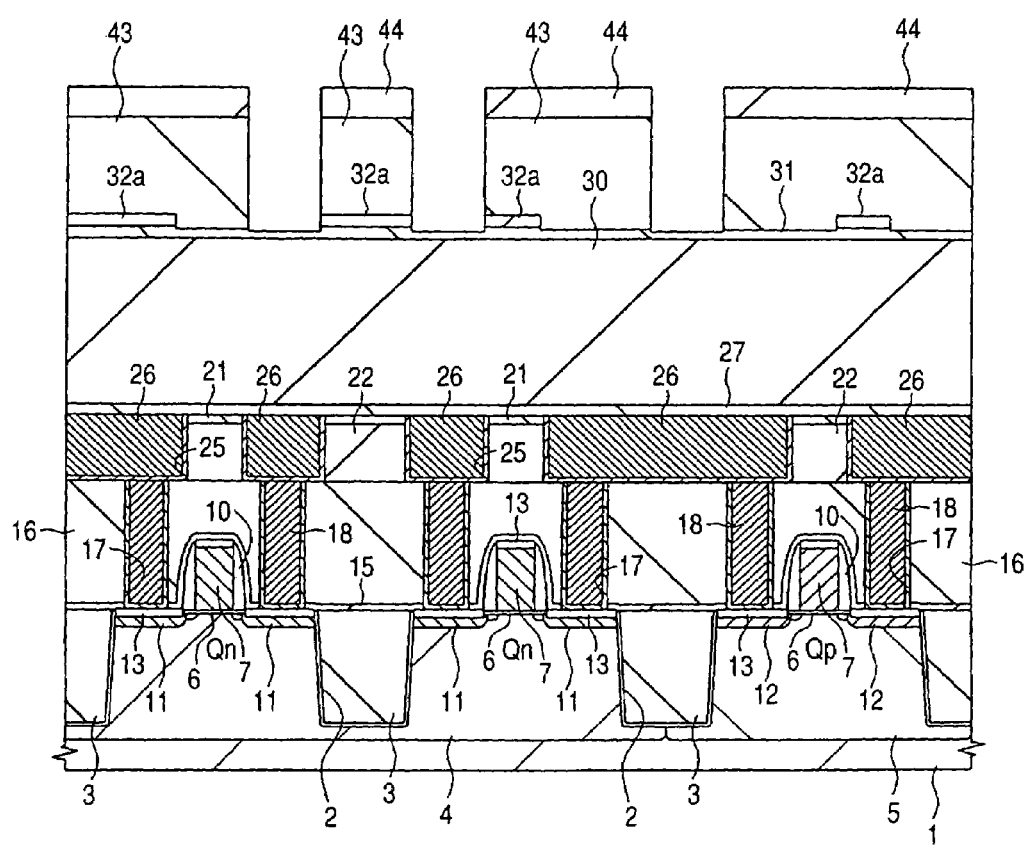
FIG. 19 is a cross-sectional view subsequent to FIG. 18 showing the principal part of a semiconductor substrate in the manufacturing process of a semiconductor device.

Next, as shown in FIG. 19, the photoresist film 46 and the antireflection film 45 are removed by ashing. At this time, since the interlayer insulator 30 is covered with the cap insulator 31, the interlayer insulator 30 is not exposed to the ashing gas.

Figure 20:
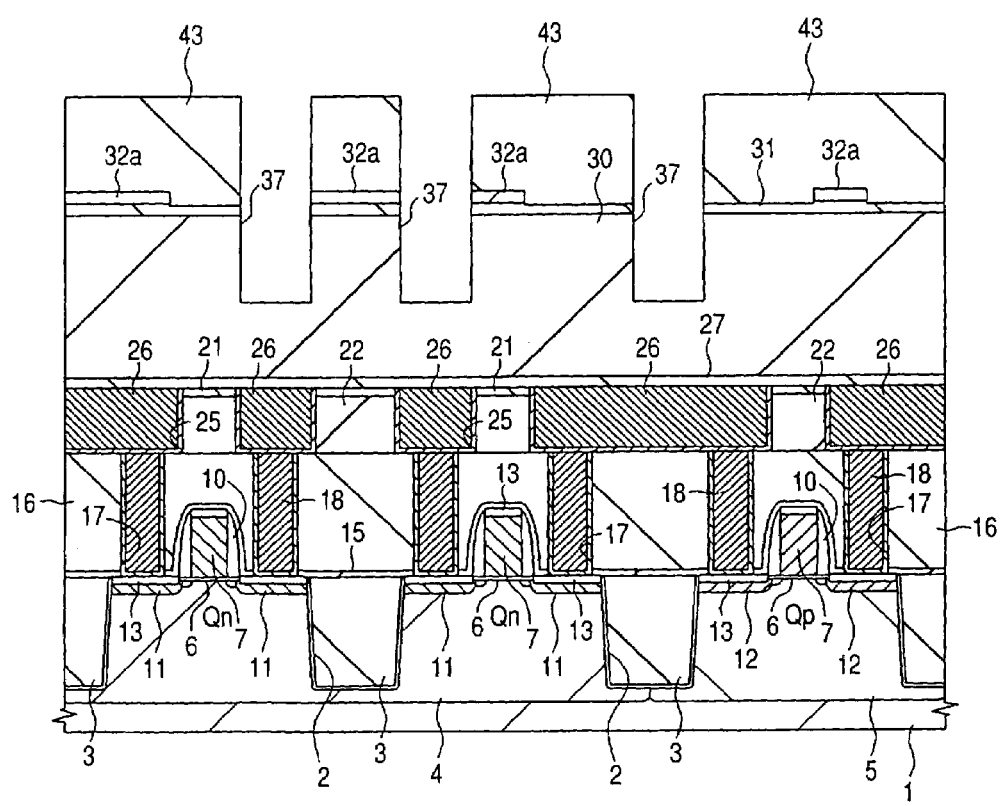
FIG. 20 is a cross-sectional view subsequent to FIG. 19 showing the principal part of a semiconductor substrate in the manufacturing process of a semiconductor device.

Next, as shown in FIG. 20, the dry etching of the cap insulator 31 and the interlayer insulator 30 is performed with using the inorganic SOG film 44 and the organic SOG film 43, in which the via hole forming regions are opened, as masks, thereby forming the via holes 37. At this time, the etching time is controlled so that the etching is stopped when the bottom surface of the via hole 37 reaches half of the thickness of the interlayer insulator 30. Alternatively, it is also preferable that the etching is continued until the bottom surface of the via hole 37 reaches the barrier insulator 27 below the interlayer insulator 30. In addition, in this process, the inorganic SOG film 44 on the organic SOG film 43 is also etched and removed when the interlayer insulator 30 is etched.

Also, though not shown, in the etching process described above, if the photoresist film 46 and the alumina mask 32a used when performing the etching of the inorganic SOG film 44 and the organic SOG film 43 are misaligned, the edge of the alumina mask 32a is exposed to the inside of the via hole 37. Therefore, the exposed part of the alumina mask 32a is also etched simultaneously, and the alumina residue 39 is adhered to the sidewall and the bottom surface of the via hole 37. For its prevention, similar to the first embodiment, the inside of the via holes 37 is cleaned by the use of dilute hydrofluoric acid so as to remove the alumina residue 39 after forming the via holes 37. At this time, since the alumina mask 32a is covered with the organic SOG film 43, the alumina mask 32a is not etched even when the hydrofluoric acid concentration in the solution is high.

Figure 21:
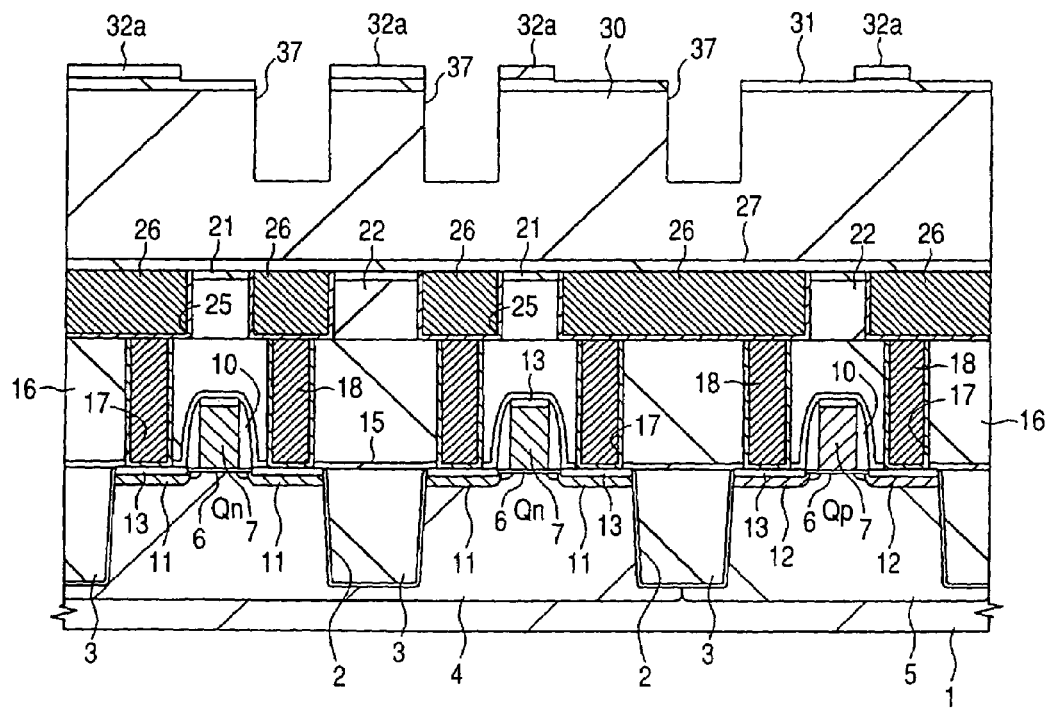
FIG. 21 is a cross-sectional view subsequent to FIG. 20 showing the principal part of a semiconductor substrate in the manufacturing process of a semiconductor device.
Figure 22:
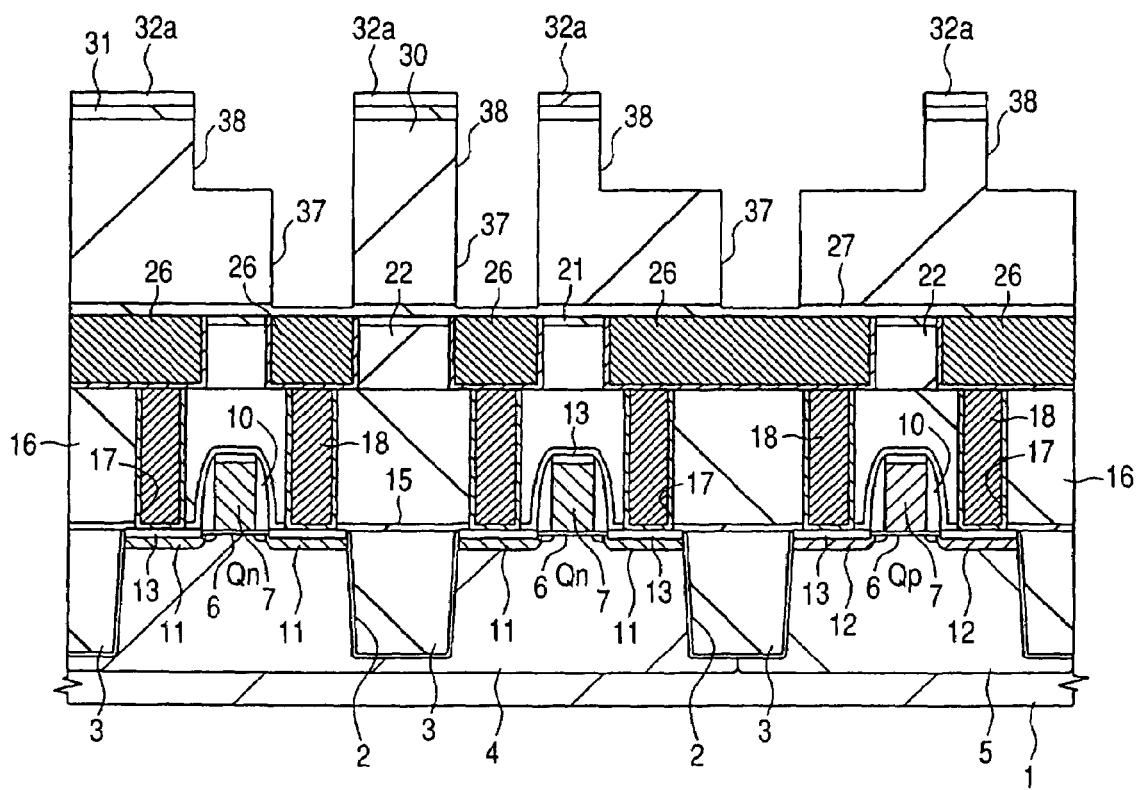
FIG. 22 is a cross-sectional view subsequent to FIG. 21 showing the principal part of a semiconductor substrate in the manufacturing process of a semiconductor device.

Next, as shown in. FIG. 21, the organic SOG film 43 is removed by wet etching, and then, the cap insulator 31 and the interlayer insulator 30 are dry-etched with using the alumina mask 32a as a mask as shown in FIG. 22, thereby forming the wiring trenches 38. Thereafter, though not shown, the alumina mask 32a is removed, and then, the second-layer wiring 41 is formed in the wiring trenches 38 and the via holes 37 in the same manner as shown in the first embodiment with reference to FIGS. 13 to 15.

As described above, according to the second embodiment, since the interlayer insulator 30 is not exposed to the ashing gas, the defect in shape of the via hole 37 can be prevented without fail, and thus, further reduction of the dielectric constant of the interlayer insulator 30 can be achieved.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is effectively applied to the manufacture of an LSI having damascene Cu wiring and a low-k insulator.

What is claimed is:
1. A method of manufacturing a semiconductor device, comprising the steps of:
   (a) forming an interlayer insulator, including a porous film comprised of a SiOC material, over a semiconductor substrate having a conductive layer thereof, and then forming an alumina film, in which wiring trench forming regions are opened, over the interlayer insulator, wherein the interlayer insulator includes a cap insulator film formed over the porous film, wherein the alumina film is formed over the porous film;
   (b) after the step (a), performing dry etching to form via holes in the interlayer insulator by using a mask film;
   (c) after the step (b), removing the mask film and cleaning the inside of the via holes by using hydrofluoric acid;
   (d) after the step (c), performing dry etching with using the alumina film as a mask to form wiring trenches in the interlayer insulator;
   (e) after the step (d), removing the alumina film; and
   (f) after the step (e), forming wiring comprised of a conductive film having copper as a main component in the via holes and in the wiring trenches for electrically connecting the wiring and the conductive layer,
   wherein in the step (d) the dry etching is performed by using etching gas comprised of carbon and fluoride.

2. The manufacturing method of a semiconductor device according to claim 1, wherein the dry etching in said step (d) is performed by using etching gas mainly consisting of carbon tetrafluoride.

3. The manufacturing method of a semiconductor device according to claim 1, wherein the dry etching in said step (d) is performed by using gas obtained by adding $O_2$ and Ar (argon) to $CHF_3$ or $C_5F_8$.

4. The manufacturing method of a semiconductor device according to claim 1, wherein concentration of said hydrofluoric acid used in said step (c) is in a range of 0.1 to 0.001%.

5. The manufacturing method of a semiconductor device according to claim 1, wherein the dry etching in said step (d) is performed under the pressure of 20 to 0.2 millitorr.

6. The manufacturing method of a semiconductor device according to claim 5, wherein the dry etching in said step (d) is performed under the pressure of 10 to 0.2 millitorr.

7. The manufacturing method of a semiconductor device according to claim 1, wherein, when forming said via holes by the etching of said interlayer insulator in said step (b), the etching is stopped when a bottom surface of said via holes reaches half of the thickness of said interlayer insulator, and when forming said wiring trenches by the etching of said interlayer insulator in said step (d), the etching is continued until the bottom of said interlayer insulator below said via holes.

8. The manufacturing method of a semiconductor device according to claim 1, wherein, when forming said via holes by the etching of said interlayer insulator in said step (b), the etching is continued until the bottom of said interlayer insulator below said via holes.

* * * * *